United States Patent [19]

Lombard et al.

[11] Patent Number: 5,431,718
[45] Date of Patent: Jul. 11, 1995

[54] HIGH ADHESION, SOLDERABLE, METALLIZATION MATERIALS

[75] Inventors: James H. Lombard; Rong F. Huang, both of Albuquerque, N. Mex.

[73] Assignee: Motorola, Inc., Schaumburg, Ill.

[21] Appl. No.: 270,339

[22] Filed: Jul. 5, 1994

[51] Int. Cl.⁶ .................................................. C23C 18/08
[52] U.S. Cl. .................................. 106/1.14; 106/1.19; 252/514
[58] Field of Search ........................... 106/1.14, 1.19; 252/514

[56] References Cited

U.S. PATENT DOCUMENTS

| | | | |
|---|---|---|---|
| 4,101,710 | 6/1978 | Marcus | 106/1.14 |
| 4,235,644 | 11/1980 | Needes | 106/1.19 |
| 4,369,063 | 1/1983 | McGowan, Jr. | 106/1.19 |
| 4,419,279 | 12/1983 | Abrams | 106/1.19 |
| 4,462,827 | 7/1984 | Rellick | 106/1.19 |
| 4,552,691 | 11/1985 | Shoji et al. | 106/1.18 |
| 4,654,095 | 3/1987 | Steinberg | 156/89 |
| 4,752,531 | 6/1988 | Steinberg | 428/426 |
| 4,847,003 | 7/1989 | Palanisamy | 106/1.15 |

*Primary Examiner*—Helene Klemanski
*Attorney, Agent, or Firm*—Kenneth M. Massaroni

[57] ABSTRACT

A high adhesion strength, co-fireable, solderable silver metallization material for use with low-fire ceramics is provided. The metallization material includes the metallization powder as well as a binder vehicle, and an adhesion promoting agent. The combination of elements allows a metallization material which can be cofired at relatively low temperatures necessary for firing ceramic substrate materials while providing an adequate base for soldering subsequent circuit components to the ceramic substrate.

15 Claims, 1 Drawing Sheet

INK ADHESION STRENGTH DATA

HIGH ADHESION, SOLDERABLE, METALLIZATION MATERIALS

TECHNICAL FIELD

This invention relates in general to the field of metallization materials for use in connection with ceramic substrates and more particularly to co-fireable, solderable metallization materials.

BACKGROUND OF THE INVENTION

In the fabrication of multi-layer ceramic modules and devices, it is traditionally been the case that thick-film silver paste is provided for plating on or plating through the ceramic substrate. Conventional, commercial thick-film silver pastes have the advantage of being co-fireable, i.e., are able to be cured in relatively high temperature ovens, along with the ceramic substrate. Unfortunately, available, commercial co-fireable silver paste metallization materials are not solderable. That is, the materials could not be used as the base upon which subsequent components, for example, diodes, could be soldered to the ceramic substrate. Further, conventional materials had the disadvantage of having poor adhesion to the ceramic substrate. Specifically, the silver paste material tended to flake or peel off of the ceramic substrate under various conditions.

As a response to these limitations, a second class of materials was developed which would tolerate soldering of subsequent components to the ceramic package. Unfortunately, such materials were not co-fireable. Accordingly, the ceramic material would first need to be cured in an oven and subsequently exposed to a second heating regime to deposit the metallization.

Regardless of the type of material chosen, in order to solder on subsequent circuit components, it would be necessary to effect at least one additional manufacturing step. This additional step has the potential of introducing numerous additional manufacturing defects into the device. For example, shrinkage differences for different lots of fired ceramic materials may cause "art work" mismatch between the original material and the second fired material. As a result, a device fabricated according to this two-step process may have higher defect rates. Moreover, the mere addition of a second step adds costs to the manufacturing process.

Accordingly, there exists a need for a metallization material which is co-fireable with most commercially available ceramic materials, and is solderable for attaching components subsequent to the manufacturing of the ceramic substrate. Further, the metallization material should also be adapted to have good adhesion to the outside of the ceramic package, discouraging peeling or flaking off of the deposited material.

DETAILED DESCRIPTION OF THE PREFERRED EMBODIMENT

Figure 1:
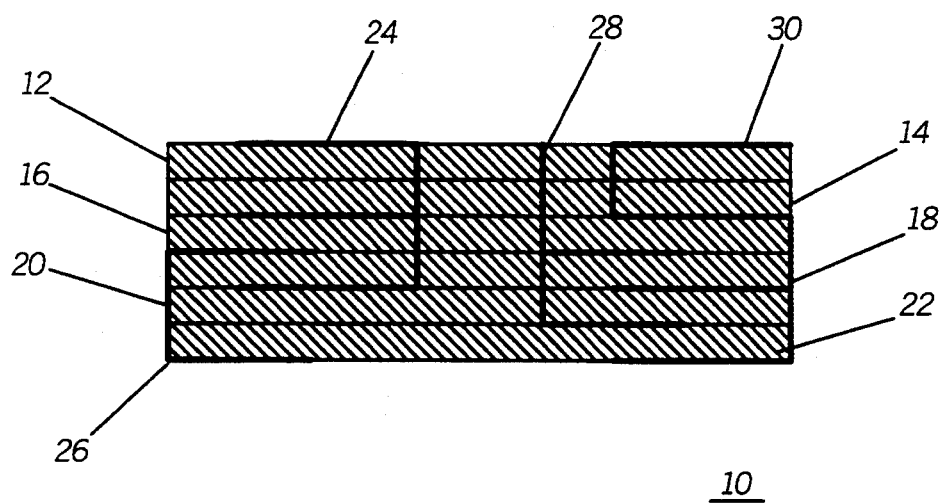
FIG. 1 is a cross-sectional view of a multilayered ceramic device package in accordance with the invention.

While the specification concludes with claims defining the features of the invention that are regarded as novel, it is believed that the invention will be better understood from a consideration of the following description in conjunction with the drawing figures, in which like reference numerals are carried forward.

The instant invention relates to metallization materials for use with ceramic substrates used in, for example, the semiconductor circuit industry. The materials disclosed herein are intended primarily for use as external metallization layers. The materials may however also be advantageously employed for current carrying layer applications.

Conventional ceramic materials are available from numerous companies, such as, for example, DuPont, which provides a ceramic system known as the GREEN TAPE TM system of ceramic materials. In this case, a spool of uncured (hence, GREEN) ceramic material is provided so that it may be sized and shaped for a particular ceramic substrate application. The specific ceramic materials are disclosed in, for example, U.S. Pat. Nos. 4,752,531 and 4,654,095. A plurality of conductive leads and/or vias may be formed on and/or through the substrate in order to effect electrical communication between various portions of the ceramic substrate. The electrical leads and vias are plated with a silver paste which may be screen printed on to the ceramic substrate, immediately prior to firing (curing) the green ceramic material.

Referring now to FIG. 1, there is illustrated therein a cross-sectional view of multi-layered ceramic circuit package in accordance with the instant invention. The multi-layered ceramic package (10) includes a plurality of layers of ceramic material (12, 14, 16, 18, 20, and 22). Each layer is fabricated of a commercially available ceramic material such as that described hereinabove. Communication between each said layer of said package (10) is effected by providing electrically conductive lines, such as (24, 26, 28, and 30). The conductive lines (24, 26, 28 and 30) are fabricated of an improved cofireable high adhesion metallization material as described in greater detail hereinbelow. These lines are provided to effect communication between various layers of the device (10). For example, conductive line (24) provides for electrical communication between layer (12), layer (16) and layer (18). Similarly, conductor line (26) provides for electrical communication between layers (18) and (22). Conductor line (28) provides for communication between layer (12) and layers (18 and 22). Finally, conductive line (30) provides for electrical communication between layer (12), layer (16), layer (18) and layer (22).

Heretofore, commercially available metallization materials such as, for example, DuPont No. 6142 silver conductor composition, were silver paste materials which were capable of being fired at the same time as the ceramic material (i.e. co-fireable) at relatively low ceramic temperatures such as, for example, 850° C. As noted above, such materials were not solderable, and hence could not be used as a base upon which to attach a circuit element to the ceramic substrate.

The instant invention addresses this problem by providing a silver metallization material for conductor lines, such as lines (24, 26, 28, and 30) of FIG. 1, fabricated of a mixture of a metal and ceramic additive powder, with an organic vehicle, which allows the silver metallization conductor to be screen printed onto the ceramic substrates to create an electrical circuit pattern. The metallization material itself comprises a silver metal powder. To the silver metallization powder is added a ceramic additive such as cobalt aluminum oxide ($CoAl_2O_4$), nickel aluminum oxide ($NiAl_2O_4$), cobalt, nickel aluminum oxide ($Co_{0.5}Ni_{0.5})Al_2O_4$ and combinations thereof. The silver metallization is comprised of a solids portion and an organic vehicle portion, with approximately 65-85% by weight of the resulting paste as solids, and a balance of organic materials in the range of 15-35% by weight. In the solids portion, silver metal is present in the range of 98 to 99% by weight, and inorganic adhesion enhancing agents are present in the range of 1-2% by weight. In one preferred embodiment, the silver metal powder has a surface area of between 0.050 and 1.50 $m^2/g$ surface area with an optimal being about 1.13 $m^2/g$. A preferred particle size range for the silver powder is between 1.0 and 5.0 microns, with a optimal value of approximately 1.50 microns.

The organic vehicle which is added to the combination of the silver metal and ceramic additive powders consists of a polymer dissolved in at least one, and preferably, several solvents. The polymer used in the organic vehicle may be any of those known in the art, and in one preferred embodiment may be ethyl cellulose. Other acceptable polymers include other cellulose polymers of various molecular weights and grades.

The polymer is dissolved in a combination of different solvents so as to provide different drying times for the polymer. Using more than one solvent also allows the polymer to dissolve more quickly and easily. Further, a plurality of solvents allows the metallization material to stay on the screen printed substrate longer before drying, since different solvents evaporate at different rates. In one preferred embodiment, the solvents used to dissolve the polymer include alpha terpineol, ester alcohol, and diethylene glycol monobutyl ether. Other solvents which may be used in the organic vehicle include, but are not limited to terpineols, such as beta terpineol.

The organic vehicle may further include plasticizers adapted to enhance the mechanical properties of the material. Examples of preferred plasticizers include dioctylphthalate, dibutyl phthalate and other phthalates. Also included in the organic vehicle may be anti-oxidation elements provided to preserve the polymer. That is, as the polymer is suspended in the solvents, the solvents have a tendency to oxidize or otherwise degrade the polymer itself. Accordingly, anti-oxidants are added in order to avoid the degradation of the polymer. Examples of preferred anti-oxidant materials include butylated hydroxy toluene (BHT).

The organic vehicle may further include dispersions agents and thickening agents to enhance the properties of the metallization materials. For example, dispersants such as a methyl quaternary of propoxylated diethyethanolamine such as Emcol CC-42, or lipophilic acid neutralized complex amines, such as Witcamine may be added to the mixture to enhance the dispersion of the metal particles therein. The thickening agents may be one of several known in the art, and include amorphous collodial silicon dioxide, known in the industry as Cab-o-sil, finely divided powder organic derivates of castor oil, such as alyceryl tris 0.12-hydroxy stearate(thixcin-E) and rheological additives, i.e., organically modified hectorite clay such as Bentone 128. The purpose of such modifiers is to enhance printability of the metallization materials over a wide range of circuit patterns. Employing the metal and ceramic powder additives, and organic vehicle described hereinabove, it is possible to provide a finished paste which can be easily screen printed on the stainless steel mesh screen over the ceramic green tape composition and then cofired in an air atmosphere at approximately 850° C. in a kiln completing the ceramic package.

An optimal blend for the organic vehicle was found to be a mixture of ethyl cellulose (4-8 wt %), ester alcohol (0.5-12 wt %) diethylene glycol monobutyl ether (0-20 wt %) dioctyl phthalate (0-20 wt %) and butylated hydroxy toluene (0.5%), and the balance being alpha terpineol. Viscosity modifiers added to the composition included Bentone 128 powder about 5.5 wt % and thixin-E thickeners (about 2.0 wt %). The viscosity modifier and thickeners were found to be helpful in the range of 0-6 wt % in addition to the paste to achieve the desired viscosity levels. In order to enhance the adhesion of the metallization layer to the ceramic material, is necessary however to provide an adhesion enhancing agent. Enhanced adhesion has been found necessary as commercial pastes have been found have adhesion strengths as low as 1 kg, as measured by 90° peel testing.

In a preferred embodiment, the adhesion agents used, like the ceramic additive powders, are transition metal aluminum oxides present in the spinel form. These types of material are very hard components compatible with commercially available ceramic compositions such as green tape. In a preferred embodiment, the transition metal aluminum oxide spinel form adhesion agent is a cobalt aluminum oxide ($CoAl_2O_4$) or a nickel aluminum oxide ($NiAl_2O_4$) adhesion material. Alternatively, the cobalt aluminum oxide could be doped with nickel to form a combination spinel with the doping level up to 50% so as to form a cobalt nickel aluminum oxide composition. The adhesion agent may be present in the metallization material in concentrations up to approximately between 0.05 and 5 wt % and preferably about 1 wt %. Moreover, it has been found that the particle size of the transition metal aluminum oxide adhesion agent must be carefully monitored so as to enhance the adhesion promoting effects of the adhesion agents. Particle size for the adhesion agents may be between 0.10 and 5.0 microns with a preferred particle size being approximately 1.5 to 1.7 microns.

The advantages of the instant invention as compared to the prior art will be made more apparent on the basis of the following comparative examples.

EXAMPLES

In order to better understand and more easily describe the examples presented below, reference will be made to Table 1 illustrating Organic Vehicle Binder Systems by Weight Percent.

Organic Vehicle Binder Systems by Weight Percent

TABLE I

| Ingredient | 1 | 2 | 3 | 4 | 5 | 6 | 7 | 8 | 9 | 10 | 11 |
|---|---|---|---|---|---|---|---|---|---|---|---|
| Ethyl Cellulose | 6 | 5.5 | 6 | 5 | 5 | 8 | 8 | 8 | — | 8 | 9 |
| Alpha Terpineol | 8 | 10 | 42 | 95 | — | 52 | 52 | 60 | — | 50 | 75.5 |
| DiButyl Monobutyl ether | 20 | 20 | 20 | — | 53.5 | 20 | 20 | 20 | — | 20 | 5 |
| DiButyl Phthalate | 53 | 53 | 20 | — | — | 10 | 10 | — | — | 10 | — |
| DiOctyl Phthalate | — | — | — | — | — | — | — | — | — | — | 5 |
| Texanol | 11 | 11.5 | 12 | — | 41.5 | 10 | 10 | 10 | — | 10 | 5 |

TABLE I-continued

| Ingredient | 1 | 2 | 3 | 4 | 5 | 6 | 7 | 8 | 9 | 10 | 11 |
|---|---|---|---|---|---|---|---|---|---|---|---|
| Thixcin-E | — | — | — | — | — | — | — | 2 | — | 2 | — |
| BHT | — | — | — | — | — | — | — | — | — | — | 0.5 |

The solvents and plasticizers used to fabricate the organic vehicle binder systems were generally weighed out into glass beakers and heated to approximately 50° C. and mixed gently with an air mixer. The binder material (ethyl cellulose) was added to the solvent solution, and gradually dissolved into the solvent mixture. The temperature ranges for dissolving the ethyl cellulose mixture was between 50° C. and 60° C. over 30 minutes to 3 hours. The finished vehicle was then cooled to room temperature and stored at least one day prior to mixing into the paste described below.

The adhesion agents used in the following examples were calculated out, batched, weighed and dry-milled for approximately 1 hour. Thereafter they were placed into a high temperature ceramic crucible and calcined at approximately 1200° C. for at least 4 hours at temperatures ranging between 1100° C. and 1300° C. with approximately one-half to ten hours at peak temperature. Following the calcining step, the powders were wet-ball milled for 24 hours to reduce the particle size to the optimal sizes described hereinabove for paste manufacturer. They were thereafter dried and deagglomerated. Compositional allowances were checked by x-ray diffraction.

Using the organic vehicle binders illustrated in Table 1, and the adhesion agent compositions described hereinabove, five sample materials were prepared and tested for adhesion strength, comparing them to a standard commercially available material known as 8710 Cermalloy as a test control. The results of the testing of the materials and the results of average adhesion strength testing is summarized hereinbelow in Table II, in FIG. 2.

TABLE II

Weight Percent Table

| Paste Number | Additive Type | Additive Amount | Vehicle Type | Avg. Adhesion Strength (kg) | General Comments |
|---|---|---|---|---|---|
| 8710 Cermalloy | Glass | about 1% | Unknown | 0.998 | Weak Adhesion, Control Ink |
| 1 | $CoAl_2O_4$ | 1% | #3 | 3.278 | Cofires flat, prints well |
| 2 | $CoAl_2O_4$ | 1% | #10 | 2.614 | Smaller part, size $CoAl_2O_4$ |
| 3 | $(CoNi)Al_2O_4$ | 1% | #10 | 2.604 | 50% Ni doped $CoAl_2O_4$ pants, cofires fine |
| 4 | $Co_2SiO_4$ | 1% | #10 | 2.732 | Cambered slightly |
| 5 | $NiAl_2O_4$ | 1% | #10 | 2.733 | Prints well, fires well |

Figure 2:
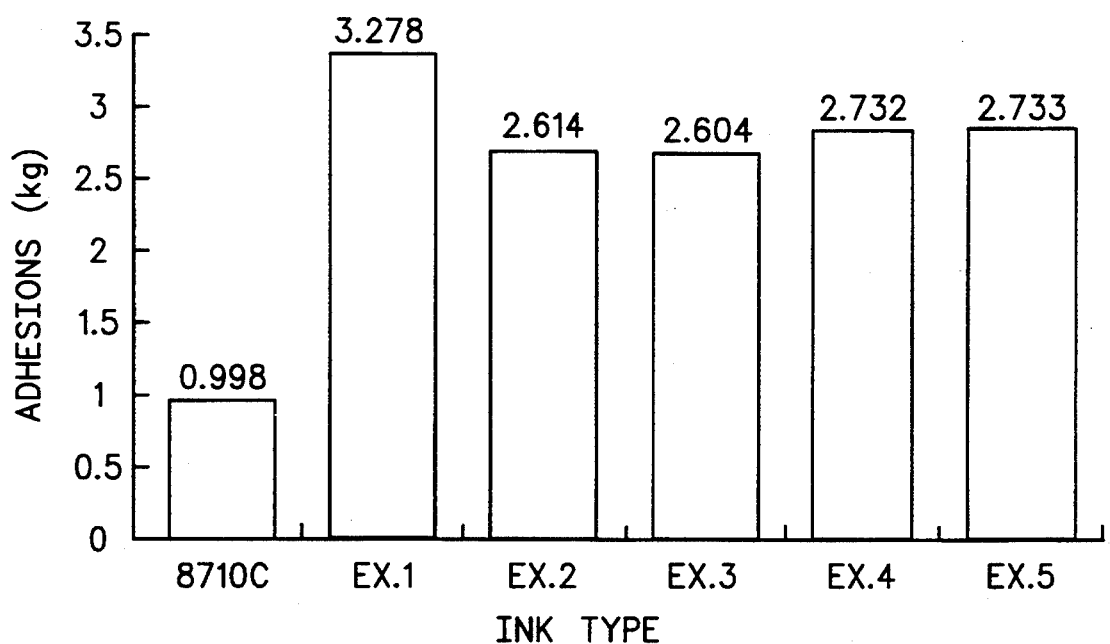
FIG. 2 is a bar chart illustrating the adhesion strength, in kg, for various metallization materials prepared in accordance with the instant invention.

The materials summarized in Table II were then subjected to testing for adhesion strength. The conditions of testing were a 90° peel test conducted on a Sebastian 5 Test machine. 100 mils square test pads were provided, and 20 gauge tinned copper wire. The solder material was a 62/36/2 composition of lead, tin and silver. The results of the adhesion testing are illustrated in FIG. 2, wherein the paste number is illustrated along the X axis, and adhesion strength in kilograms is illustrated along the Y axis. A perusal of FIG. 2, illustrates that the co-fireable high-adhesion metallization materials provided according to the instant invention had adhesion strength substantially greater than the 8710 Cermalloy control material, with paste number 1 having the best adhesion strength.

While the preferred embodiments of the invention have been illustrated and described, it will be dear that the invention is not so limited. Numerous modifications, changes, variations, substitutions and equivalents will occur to those skilled in the art without departing from the spirit and scope of the present invention as defined by the appended claims.

What is claimed is:

1. A high adhesion solderable metallization material for use, and co-fireable with ceramic materials, said metallization material comprising:

99 wt. % of a silver metal powder/ceramic additive powder mixture, said mixture having particle size in the range of 1.0 to 5.0 microns;

an organic binder material comprising a polymer dissolved in a plurality of solvents, an anti-oxidation material, a plasticizing agent, a viscosity modifying material and a dispersion material; and a transition metal aluminum oxide adhesion enhancing agent having a particle size of between 0.1 and 5.0 microns.

2. A metallization material as in claim 1, wherein said ceramic additive powder is selected from the group of material consisting of $CoAl_2O_4$, $NiAl_2O_4$, $(Co_{0.5}Ni_{0.5})$, $Al_2O_4$, and combinations thereof.

3. A metallization material as in claim 1, wherein said polymer is ethyl cellulose.

4. A metallization material as in claim 1, wherein said solvent is selected from the group consisting of terpineol, ester alcohol, diethylene glycol monobutyl ether, and combinations thereof.

5. A metallization material as in claim 1, wherein said anti-oxidation material is butylated hydroxy toluene.

6. A metallization material as in claim 1, wherein said plasticizing agent is dioctyl phthalate.

7. A metallization material as in claim 1, wherein said viscosity modifying agent is further adapted to enhance printability of said metallization material, and is selected from the group of materials consisting of, glyceryl tris 12-hydroxy stearate, colloidal silicon dioxide powder, hectorite clays, and combinations thereof.

8. A metallization material as in claim 1, wherein said organic binder material further includes a dispersant selected from the group of materials consisting of methyl quaternaries of propoxylated diethyl ethanolamines.

9. A metallization material as in claim 1, wherein said transition metal aluminum oxide is a spinel form transition metal aluminum oxide.

10. A metallization material as in claim 9, wherein said transition metal aluminum oxide is $CoAl_2O_4$.

11. A metallization material as in claim 1, wherein said adhesion enhancing agent is present in said material in amounts between 0.1 and 5.0 wt. %.

12. A high-adhesion, solderable metallization material for use with ceramic materials, said metallization materials for use with ceramic materials, said metallization material comprising:
   a silver metal powder;
   an organic binder material; and
   an adhesion enhancing agent, said adhesion enhancing agent consisting of a spinel form transition metal aluminum oxide material selected from the group of materials consisting of $CoAl_2O_4$, $NiAl_2O_4$, $(Co_{0.5}Ni_{0.5})Al_2O_4$, and combinations thereof.

13. A metallization material as in claim 12, wherein said organic binder material further comprises:
   a polymer dissolved in at least one solvent selected from the group consisting of terpineol, ester alcohol, diethylene glycol, monobutylether and combinations thereof;
   a dioxthyphthalate plasticizing agent; and
   a viscosity modifying agent selected from the group of materials consisting of glyceryl tris 12-hydroxy stearate, colloidial silicon dioxide powder, hectorite clays, and combinations thereof.

14. A metallization material as in claim 13, wherein said polymer is ethyl cellulose.

15. A metallization material as in claim 12, further including a dispersant selected from the group of materials consisting of methyl quaternaries of propoxolated diethyl ethanolamines.

* * * * *